(12) United States Patent
Tsai et al.

(10) Patent No.: US 12,392,827 B2
(45) Date of Patent: Aug. 19, 2025

(54) FULL-OPEN AND FULL-ANGLE STALL DEVICE FOR MOTOR TEST SYSTEM

(71) Applicant: CHROMA ATE INC., Taoyuan (TW)

(72) Inventors: Cheng-Hsuan Tsai, Taoyuan (TW); Chun-Pin Yang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 194 days.

(21) Appl. No.: 18/229,267

(22) Filed: Aug. 2, 2023

(65) Prior Publication Data
US 2024/0219467 A1  Jul. 4, 2024

(30) Foreign Application Priority Data
Dec. 29, 2022  (TW) ................. 111214556

(51) Int. Cl.
*G06F 9/54* (2006.01)
*G01R 31/34* (2020.01)

(52) U.S. Cl.
CPC .................. *G01R 31/343* (2013.01)

(58) Field of Classification Search
CPC ........ H02K 11/20; H02K 7/003; H02K 7/108; H02K 7/112; G01R 31/343
See application file for complete search history.

(56) References Cited

U.S. PATENT DOCUMENTS

| | | | |
|---|---|---|---|
| 6,577,137 B1 * | 6/2003 | Fisher ................. | G01R 31/343 324/765.01 |
| 10,348,223 B1 * | 7/2019 | Khosravi ............ | G01R 31/343 |

FOREIGN PATENT DOCUMENTS

| | | |
|---|---|---|
| KR | 101433260 B | 8/2014 |
| KR | 1020170005304 A | 1/2017 |

* cited by examiner

*Primary Examiner* — Muhammad S Islam
(74) *Attorney, Agent, or Firm* — WPAT, PC

(57) ABSTRACT

A full-open and full-angle stall device for a motor test system is disclosed. The stall device is used to provide a stall function to a motor under test and includes a base, a driving source connection module and a brake module. The driving source connection module includes a coupling and a first disc and a second disc that are detachably joined together. The first disc and the second disc are fixed on the coupling. The coupling is defined with a mounting hole for connecting a transmission shaft so as to receive a driving source from the motor under test. The brake module is disposed on the base and is configured at an edge of the driving source connection module, and is controlled to generate a clamping force on the driving source connection module, wherein the clamping force is selectively applied to any edge of the first disc and the second disc so as to brake the driving source connection module.

15 Claims, 8 Drawing Sheets

FULL-OPEN AND FULL-ANGLE STALL DEVICE FOR MOTOR TEST SYSTEM

BACKGROUND OF THE INVENTION

Field of the Invention

The present invention relates to a stall device, and more particularly to a stall device used to stall a transmission shaft of a motor under test in a motor test system.

Description of the Prior Art

In a motor test system, there are some test items in scenarios where a driving shaft of a motor under test needs to be stalled, so as to test the characteristic parameters of the motor under conditions such as uphill testing, maximum torque testing or extreme conditions. Accordingly, a motor test platform is provided with a stall mechanism to provide a motor under test with a stall function.

A conventional stall mechanism includes a stall disc, a base and insert pins. The stall disc is installed on a driving shaft of the motor under test or a transmission shaft coupled to the driving shaft. The stall disc has a plurality of insert holes in an annular arrangement, and the base has corresponding fixing holes. By inserting the insert pins into specific insert holes or fixing holes, the stall disc is prohibited from rotating relative to the base, such that the driving shaft of the motor under test or the transmission shaft coupled to the driving shaft becomes stuck, hence achieving the stall function.

However, angles at which the driving shaft of the motor under test or the transmission shaft coupled to the driving shaft may be limited by pitches of the insert holes of the stall disc; that is, it may not be possible to achieve stalling at any desired position, resulting in complications in processes such as origin establishment or origin matching in control of test software. Further, the stall disc is installed by means of axial insertion on the driving shaft of the motor under test or the transmission shaft coupled to the driving shaft, and devices needed for other test items are at the same time configured on the driving shaft of the motor under test or the transmission shaft coupled to the driving shaft. Thus, even if a test item does not need to implement the stall function, the stall disc still cannot be removed, for the reasons that the removal of the stall disc itself and installation of devices needed for other test items bring complex alignment and calibration procedures. As a result, the moment of inertia during motor testing cannot be satisfactorily reduced, and hence the time needed for increasing the rotating speed of the driving shaft or the transmission shaft cannot be shortened.

SUMMARY OF THE INVENTION

It is an object of the present invention to solve the issues of complex calibration and alignment procedures when a stall device is sleeved on a transmission shaft of a motor under test in conventional motor testing.

It is another object of the present invention to improve the time and effort consuming processes of origin matching or origin establishment of the test software caused by limitations from adjustments in only non-continuous values of stall angles of a stall device relative to a transmission shaft of a motor under test in conventional motor testing.

It is yet another object of the present invention to provide a more convenient and easy process for mounting a stall device to a transmission shaft of a motor under test.

To achieve the above and other objects, the present invention provides a full-open and full-angle stall device for a motor test system. The stall device includes a base, a driving source connection module and a brake module. The driving source connection module includes a coupling and a first disc and a second disc that are detachably joined together. The first disc and the second disc are fixed on the coupling. The coupling is defined with a mounting hole for connecting a transmission shaft so as to receive a driving source from a motor under test. The brake module is disposed on the base and is configured at an edge of the driving source connection module, and is controlled to generate a clamping force on the driving source connection module, wherein the clamping force is selectively applied to any edge of at least one of the first disc and the second disc so as to brake the driving source connection module.

In one embodiment of the present invention, the coupling has a first bushing fixed on the first disc and a second bushing fixed on the second disc.

In one embodiment of the present invention, the stall device further includes a plurality of positioning pins, wherein each of the positioning pins is embedded between the first disc and the second disc.

In one embodiment of the present invention, a first abutting surface of the first disc and a second abutting surface of the second disc are coplanar with a central axis of the mounting hole.

According to the above embodiments of the present invention, the stall device provides features of full-open installation/removal and full-angle brake. With the driving source connection module that is installed by means of non-axial insertion on a transmission shaft, complex calibration and inconvenience caused by axial installation can be eliminated. Further, when test items that do not need the stall function to be carried out, a part or entire of the driving source connection module can be quickly and conveniently removed, so as to reduce the moment of inertia of synchronous rotation with the motor under test in course of testing. Meanwhile, a clamping force can be applied by the brake module to any position as desired on edges of the driving source connection module so that the stall angle of the transmission shaft and the motor under test connected thereto is not limited, hence improving convenience and functionality of control and operation of the motor test system.

DETAILED DESCRIPTION OF THE EMBODIMENTS

Objectives, features, and advantages of the present disclosure are hereunder illustrated with specific embodiments, depicted with drawings, and described below.

In the disclosure, descriptive terms such as "a" or "one" are used to describe the unit, component, structure, device, module, portion, section or region, and are for illustration purposes and providing generic meaning to the scope of the present invention. Therefore, unless otherwise explicitly specified, such description should be understood as including one or at least one, and a singular number also includes a plural number.

In the disclosure, descriptive terms such as "include, comprise, have" or other similar terms are not for merely limiting the essential elements listed in the disclosure, but can include other elements that are not explicitly listed and are however usually inherent in the units, components, structures, devices, modules, portions, sections or regions.

In the disclosure, the terms similar to ordinals such as "first" or "second" described are for distinguishing or referring to associated identical or similar components or structures, and do not necessarily imply the orders of these components, structures, portions, sections or regions in a spatial aspect. It should be understood that, in some situations or configurations, the ordinal terms could be interchangeably used without affecting the implementation of the present invention.

Figure 1:
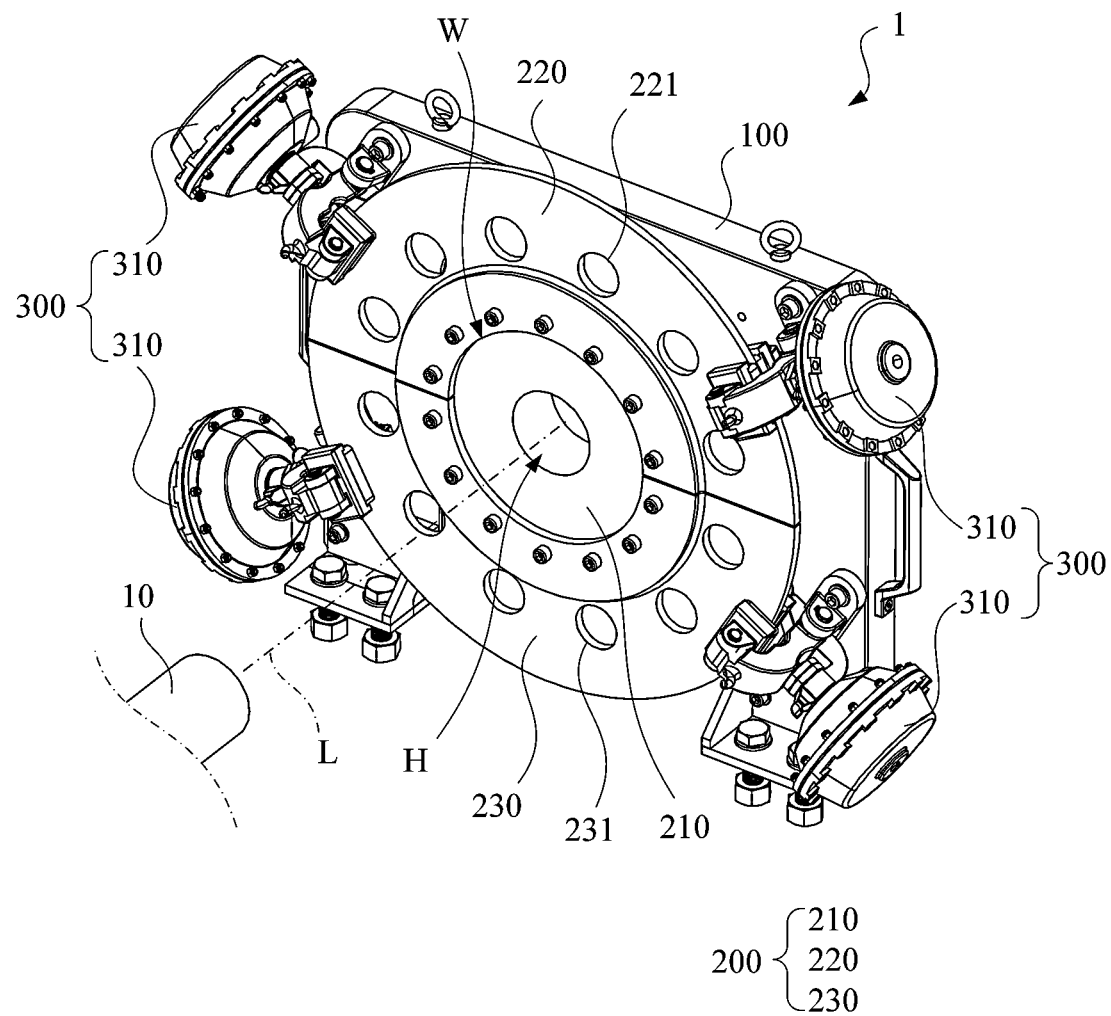
FIG. 1 is a perspective schematic diagram of a stall device according to an embodiment of the present invention.
Figure 2:
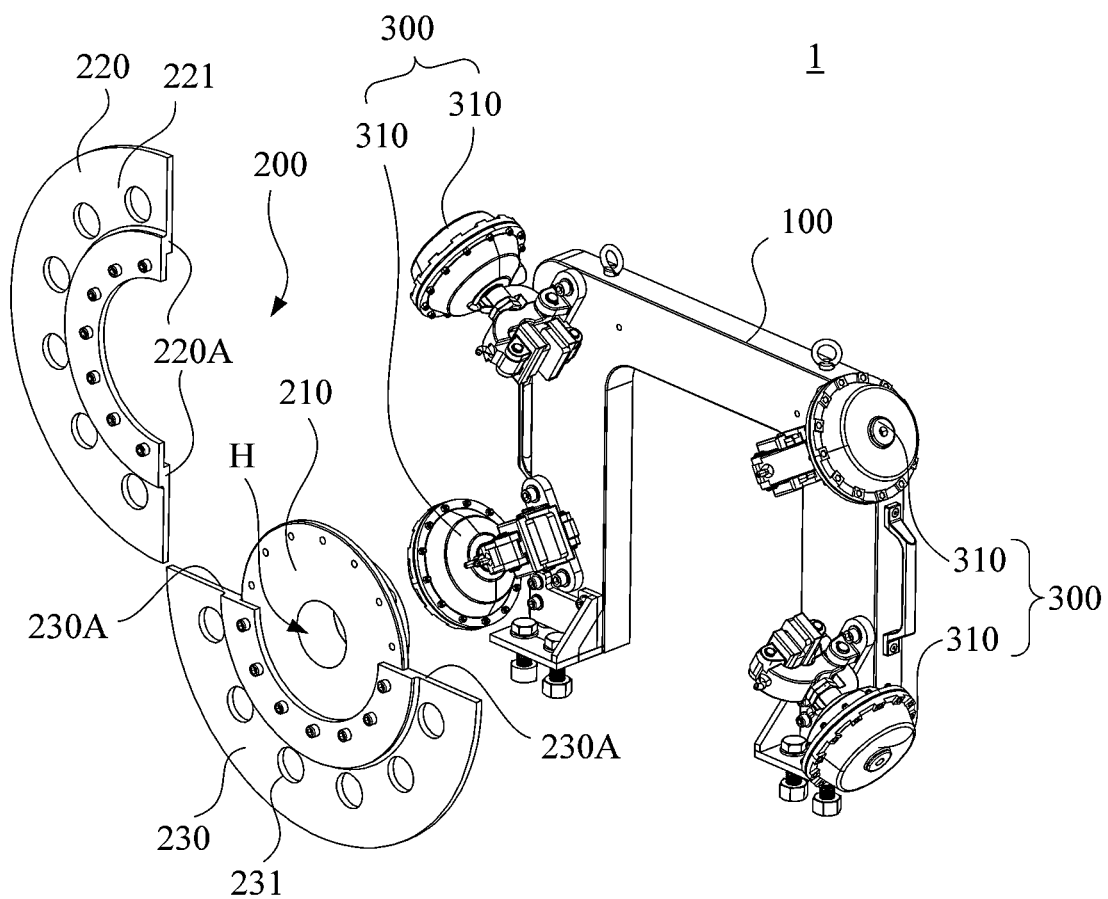
FIG. 2 is an exploded schematic diagram of a stall device according to an embodiment of the present invention.

Refer to FIG. 1 and FIG. 2. FIG. 1 shows a perspective schematic diagram of a stall device according to an embodiment of the present invention, and FIG. 2 shows an exploded schematic diagram of a stall device according to an embodiment of the present invention.

A stall device 1 according to an embodiment of the present invention is used in a motor test system so as to stall a motor under test in motor related test items (for example, uphill testing and maximum torque testing). More specifically, the stall device 1 is a device which simulates a scenario with an overweight load or a zero rotating speed in motor testing in a way that a driving shaft of the motor under test becomes still. The full-open and full-angle stall device 1 of this embodiment includes a base 100, a driving source connection module 200 and a brake module 300.

The base 100 is disposed on a test platform (not shown) of the motor test system. The test platform in general further includes, for example but not limited to, other devices such as a bearing box, a torque meter and a dynamic simulator for testing the characteristic parameters of the motor.

The driving source connection module 200 is for directly or indirectly connecting to a driving shaft of the motor under test. The driving source connection module 200 includes a coupling 210, and a first disc 220 and a second disc 230 that are detachably joined together. The first disc 220 and the second disc 230 are fixed on the coupling 210. The coupling 210 is defined with a mounting hole H for connecting a transmission shaft 10 so as to receive a driving source from a motor under test. Thus, the first disc 220 and the second disc 230 can be installed by means of non-axial insertion on the coupling 210 so as to be joined with the transmission shaft 10, further achieving effects of full-open installation or removal.

Figure 3:
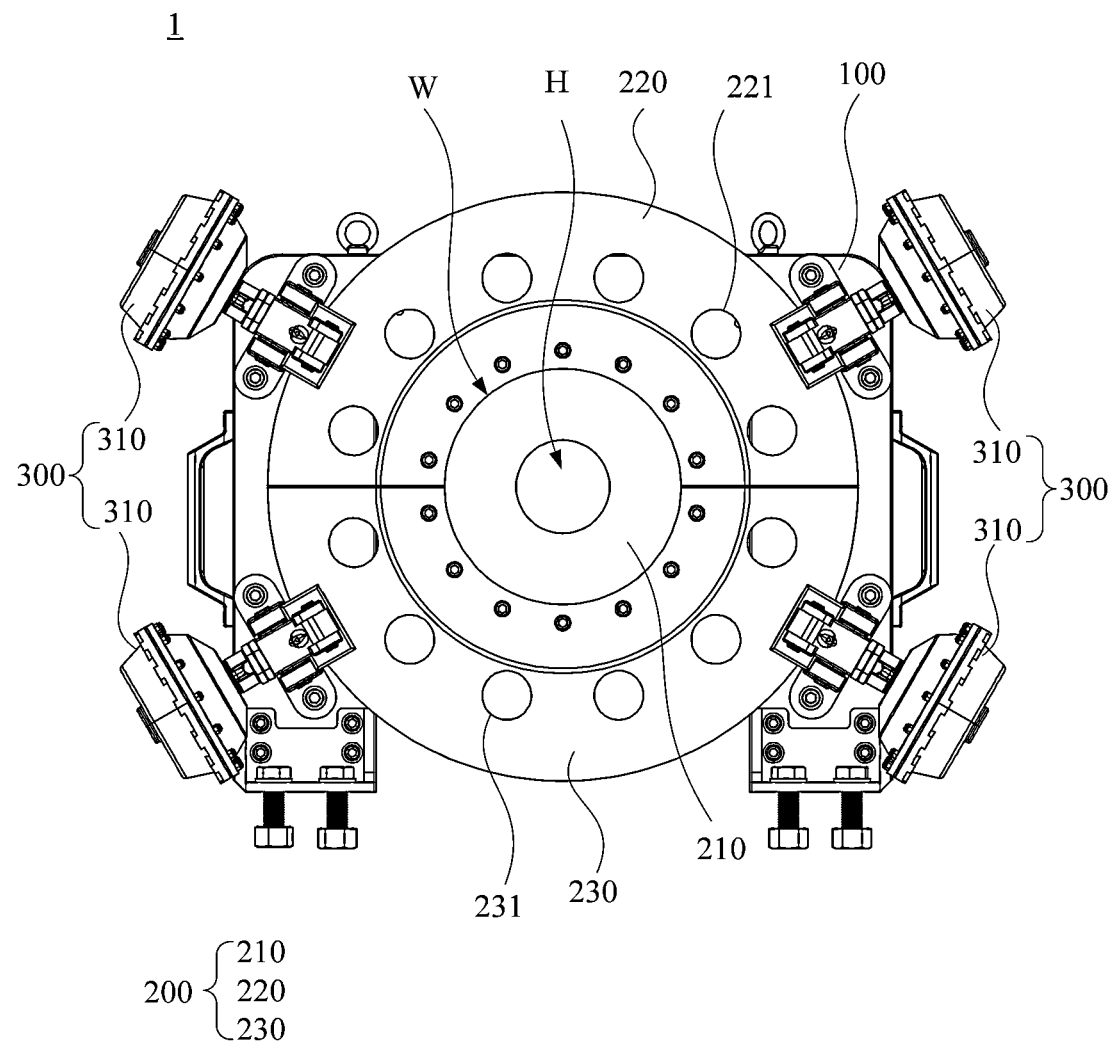
FIG. 3 is a front schematic diagram of the stall device in FIG. 1.

For example, a first abutting surface 220A of the first disc 220 and a second abutting surface 230A of the second disc 230 are coplanar with a central axis L (FIG. 1) of the mounting hole H. Also refer to FIG. 3. FIG. 3 shows a front schematic diagram of the stall device in FIG. 1. Each of the first disc 220 and the second disc 230 may be a semi-circular disc having a window W located at the center, and shapes of the first disc 220 and the second disc 230 are symmetrical to a joint line formed by joining the first abutting surface 220A and the second abutting surface 230A. The joint line is not limited to being a straight line; that is to say, the first abutting surface 220A on the first disc 220 and the second abutting surface 230A on the second disc 230 may form multiple planes (for example, stepped shapes that can be fitted or embedded with one another) or arc surfaces.

In this embodiment, the transmission shaft 10 may be the driving shaft of the motor under test itself or an extension shaft having a longer length (connected to the driving shaft of the motor under test so as to be readily to be installed with other test devices), and the coupling 210 is joined on the transmission shaft 10 so as to receive the driving source of the motor under test and to operate synchronously.

The brake module 300 is disposed on the base 100 and configured at an edge of the driving source connection module 200, and is controlled to generate a clamping force on the driving source connection module 200, wherein the clamping force is selectively applied to any edge of at least one of the first disc 220 and the second disc 230 so as to brake the driving source connection module 200. By means of clamping the driving source connection module 200 by the brake module 300, the rotating speed of the transmission shaft 10 joined with the driving source connection module 200 becomes zero, achieving the stall state of the motor under test so as to readily perform required testing.

Since the brake module 300 can clamp at any position on the edges of the first disc 220 and/or the second disc 230, full-angle stalling can be achieved for the motor under test, accordingly providing more simple and convenient steps for origin establishment during the motor test procedure.

The brake module 300 may also include a plurality of brakes 310 distributed around the driving source connection module 200, wherein each brake 310 is for applying a clamping force on the edge of the corresponding first disc 220 or the second disc 230 so as to brake the driving source connection module 200. In this embodiment, the brake 310 is provided as four in quantity, and the brakes 310 are configured at positions on a disc formed after the first disc 220 and the second disc 230 are joined and spaced by a quarter of the central angle. The brake 310 may be, for example, a caliper, which can clamp the edge of the first disc 220 or the second disc 230 at the corresponding position, so that the first disc 220 and the second disc 230 are braked, and the transmission shaft connected to the coupling 210 is also together stopped.

In the stall device 1 of this embodiment, the first disc 220 and the second disc 230 have a feature of being joined with the transmission shaft 10 by non-axial insertion on the coupling 210. Thus, in testing other items that do not need the stall function, the first disc 220 and the second disc 230 do not need to be installed in the motor test system, thereby reduce the overall moment of inertia, lowering the possibility of resonance caused by mass imbalance and reducing the time needed for increasing the rotating speed. When the stall function is needed in motor testing, the first disc 220 and the second disc 230 are then installed radially, wherein the installation and removal processes thereof are independent from other devices axially installed on the transmission shaft. Thus, changes in the transmission shaft of the motor under test can be avoided, hence eliminating re-alignment and re-calibration complications.

The first disc 220 and the second disc 230 have a plurality of through holes 221 and 231, respectively. The through holes 221 and 231 are evenly and equidistantly arranged at equal central angles on the first disc 220 and the second disc 230, so as to reduce the mass of the first disc 220 and the second disc 230. The numbers, positions and apertures of the through holes 221 and 231 can be designed and configured according to the sizes of the first disc 220 and the second disc 230 and the required material strength.

Figure 4:
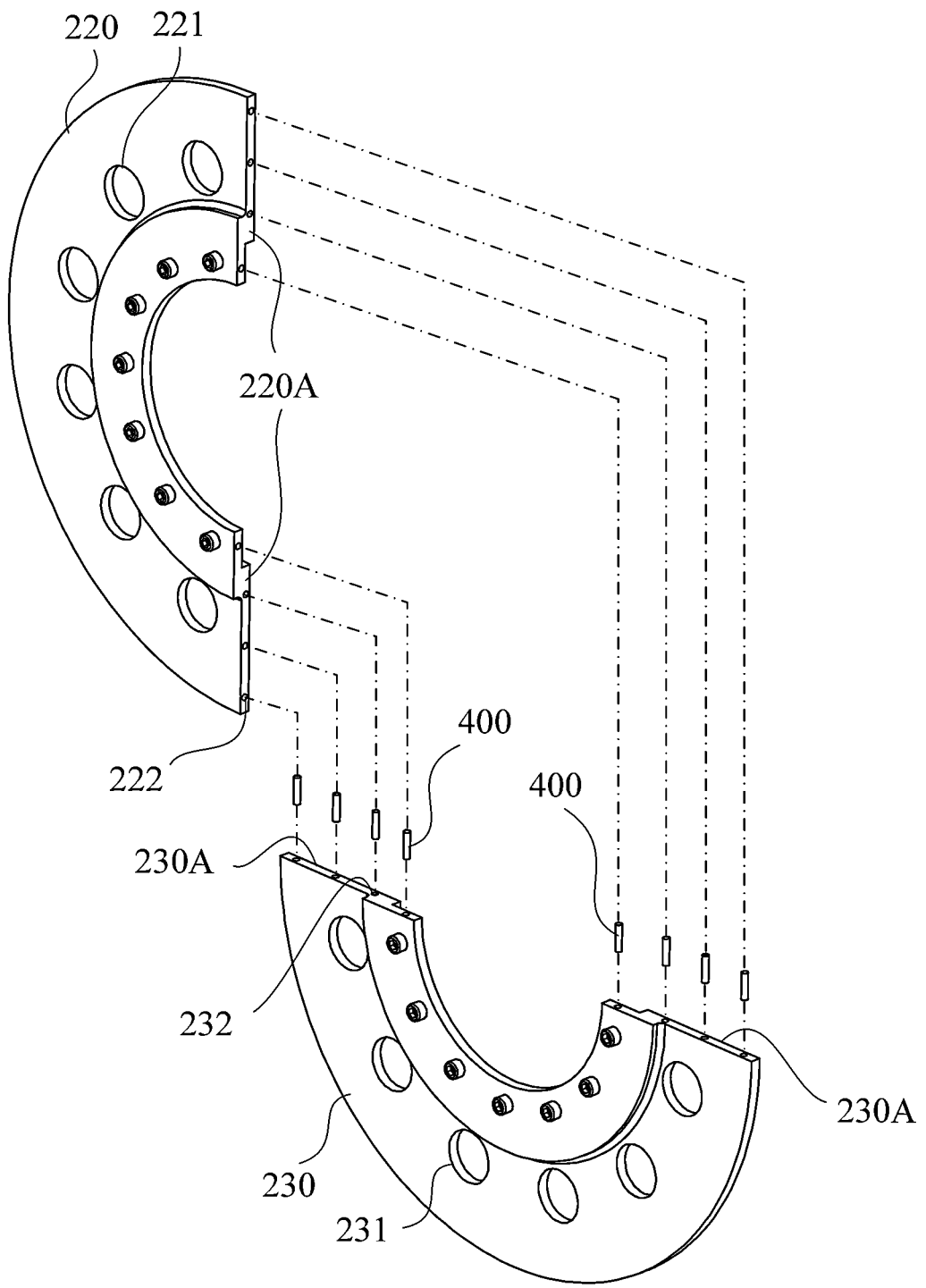
FIG. 4 is a perspective schematic diagram of a stall device having positioning pins according to an embodiment of the present invention.

Refer to FIG. 4. FIG. 4 shows a perspective schematic diagram of a stall device having positioning pins according to an embodiment of the present invention.

The stall device 1 may further include a plurality of positioning pins 400, wherein each of the positioning pins 400 is for embedding between the first disc 220 and the second disc 230 so as to limit relative movements between the first disc 220 and the second disc 230.

As an example, the first abutting surface 220A of the first disc 220 has a plurality of first positioning holes 222 for inserting the corresponding positioning pins 400, and the second abutting surface 230A of the second disc 230 has a plurality of second positioning holes 232 for inserting the corresponding positioning pins 400. Each positioning pin 400 is simultaneously accommodated in the corresponding first positioning hole 222 and second positioning hole 232.

The configuration positions of the positioning pin 400 and the corresponding first positioning hole 222 and the second positioning hole 232 are in an equidistant arrangement, so as to evenly distribute the mass and forces received. However, the positions and numbers of the positioning pin 400 and the corresponding first positioning hole 222 and the second positioning hole 232 are not limited to the examples given in this embodiment, and may be modified according to the sizes of areas of the first abutting surface 220A of the first disc 220 and the second abutting surface 230A of the second disc 230.

Figure 5:
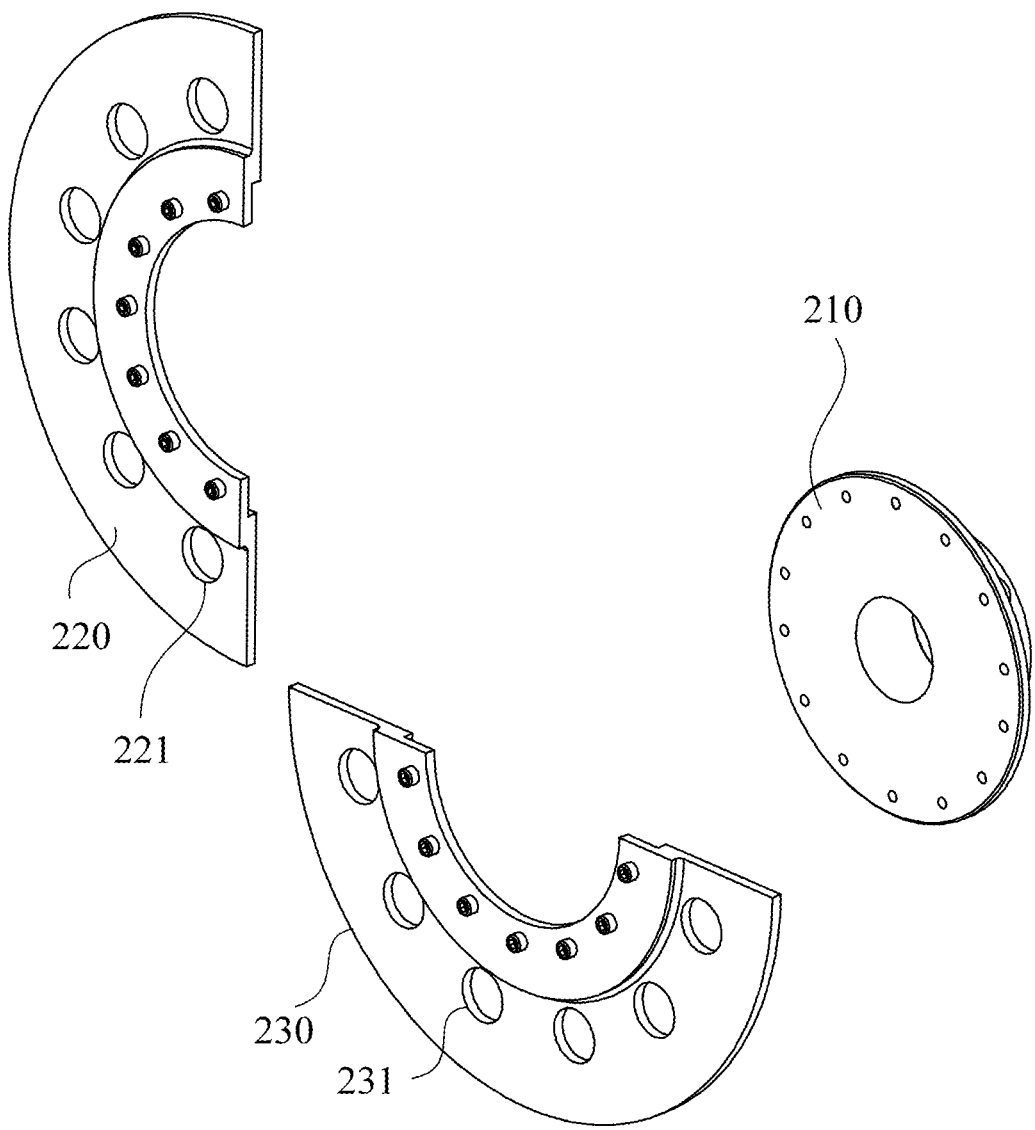
FIG. 5 is an exploded schematic diagram of a driving source connection module according to an embodiment of the present invention.
Figure 6:
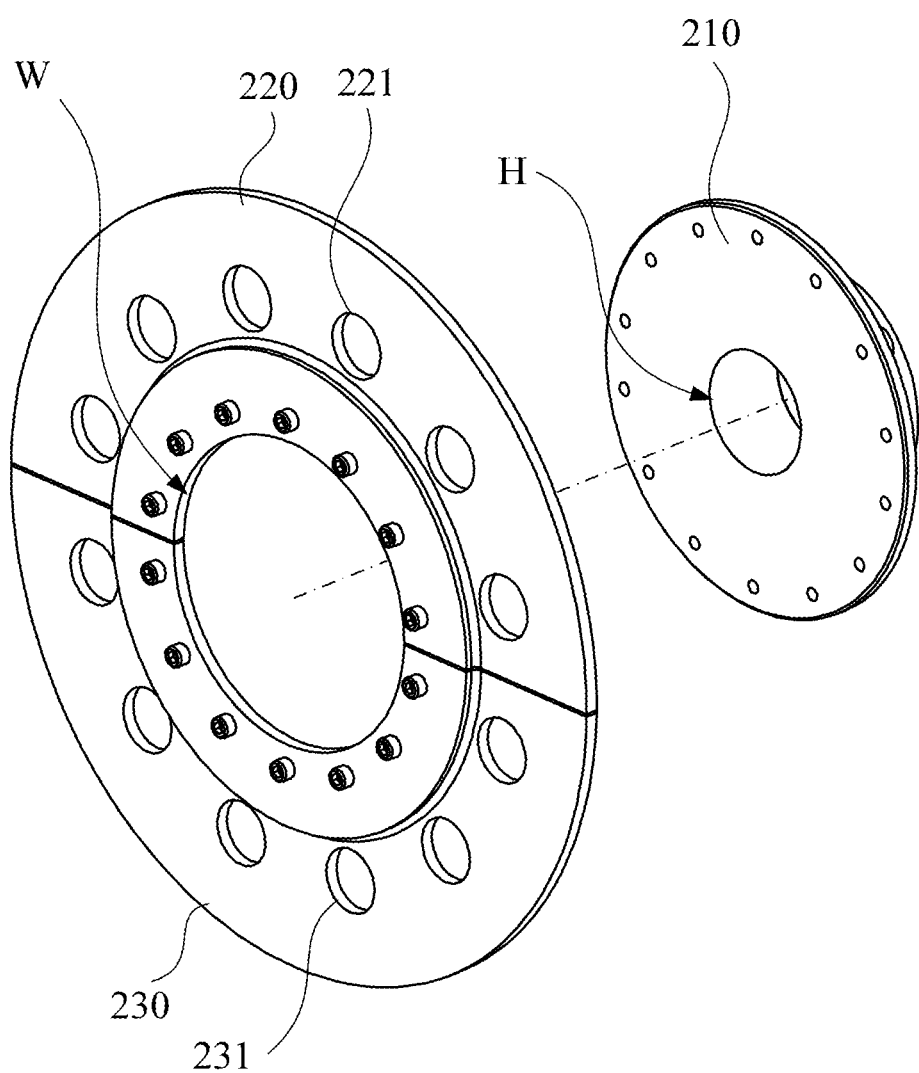
FIG. 6 is a partial exploded schematic diagram of a driving source connection module according to an embodiment of the present invention.

Refer to FIG. 5 and FIG. 6. FIG. 5 shows an exploded schematic diagram of a driving source connection module according to an embodiment of the present invention, and FIG. 6 shows a partial exploded schematic diagram of a driving source connection module according to an embodiment of the present invention.

In one embodiment of the driving source connection module 200, the coupling 210 can be an integral axially inserted on the transmission shaft 10. When test items that do not need the stall function are carried out during the test process of the motor under test, only the first disc 220 and the second disc 230 that are non-axially inserted are removed, so as to achieve the object of reducing the moment of inertia.

As shown in FIG. 6, during installation, once the first disc 220 and the second disc 230 are joined, the first disc 220 and the second disc 230 have a window W formed at a center part for the transmission shaft to pass through. The window W coincides with the central axis of the mounting hole H, the first disc 220 can be fixed on a part of the coupling 210 (the upper half shown in the drawing), and the second disc 230 can be fixed on the other part of the coupling 210 (the lower half shown in the drawing). In the example shown in the drawing, the first disc 220 and the second disc 230 are locked at corresponding positions on the coupling 210 by a plurality of screws.

Figure 7:
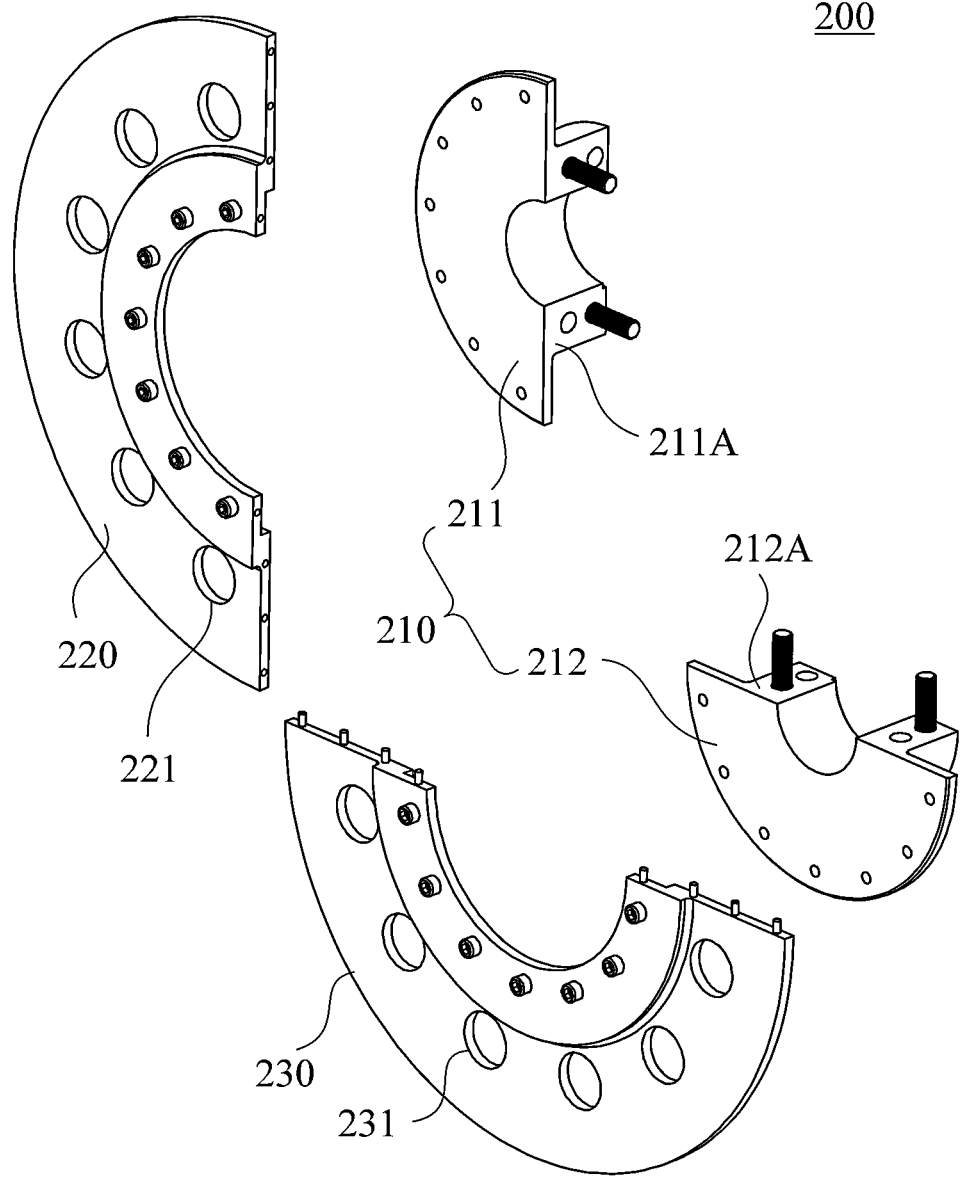
FIG. 7 is an exploded schematic diagram of a driving source connection module according to another embodiment of the present invention.

Refer to FIG. 7. FIG. 7 shows an exploded schematic diagram of a driving source connection module according to another embodiment of the present invention.

In the driving source connection module 200 of another embodiment, the coupling 210 has a first bushing 211 fixed on the first disc 220 and a second bushing 212 fixed on the second disc 230, so as to be installed by means of non-axial insertion on the transmission shaft 10 by using the first bushing 211 and the second bushing 212. A third abutting surface 211A of the first bushing 211 and a fourth abutting surface 212A of the second bushing 212 are joined together, and are coplanar with the central axis of the mounting hole H.

Thus, the coupling 210 is installed on the transmission shaft by means of joint clamping of the first bushing 211 and the second bushing 212 (as shown in FIG. 1) but is not axially inserted on the transmission shaft. Thus, when test items that do not need the stall function are carried out, the coupling 210 can also be easily and conveniently removed from the motor test system. That is to say, the entire driving source connection module 200 can be easily and conveniently operated for both installation and removal, further reducing the moment of inertia for test items that do not need the stall function, and eliminating the complex re-positioning and re-calibration steps after the installation or removal.

Figure 8:
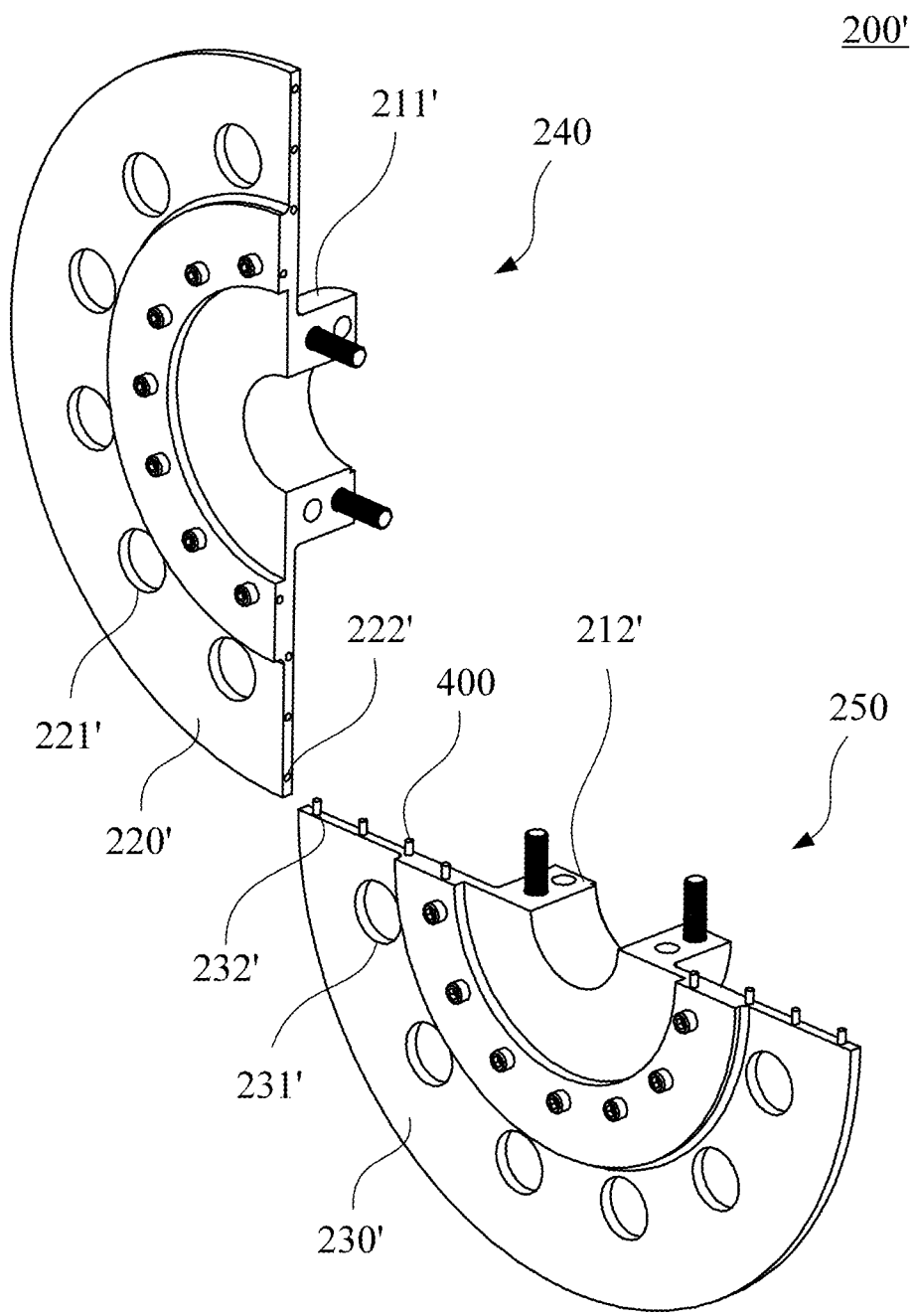
FIG. 8 is an exploded schematic diagram of a driving source connection module according to yet another embodiment of the present invention.

Refer to FIG. 8. FIG. 8 shows an exploded schematic diagram of a driving source connection module according to yet another embodiment of the present invention.

A driving source connection module 200' includes a first connecting unit 240 and a second connecting unit 250 detachably joined together. The body of the first connecting unit 240 has a first disc section 220' and a first bushing section 211', and the body of the second connecting unit 250 has a second disc section 230' and a second bushing section 212'. On the basis of joining of the first connecting unit 240 and the second connecting unit 250 with each other, the first bushing section 211' and the second bushing section 212' define a mounting hole for connecting the transmission shaft so as to receive a driving source from a motor under test.

In this embodiment, the first connecting unit 240 includes the first disc section 220' and the first bushing section 211' formed as an integral, the second connecting unit 250 includes the second disc section 230' and the second bushing section 212' formed as an integral, and the transmission shaft is clamped by the first bushing section 211' and the second bushing section 212' coupled thereto. Thus, the first connecting unit 240 and the second connecting unit 250 can be installed by means of non-axial insertion on the transmission shaft, providing advantages of easy installation and removal.

Similar to the embodiments above, in this embodiment, the clamping force applied by the brake module can be selectively applied on any edge of at least one of the first disc section 220' and the second disc section 230', so as to brake the driving source connection module 200' and further providing a zero rotating speed of the transmission shaft.

Moreover, similar to the first disc and the second disc in the embodiments above, the first disc section 220' and the second disc section 230' of this embodiment can also be configured with through holes 221' and 231', respectively, and the first disc section 220' and the second disc section 230' can be mutually limited by embedding of the positioning pins 400 in between. Correspondingly, surfaces of the first disc section 220' and the second disc section 230' facing each other can respectively have first positioning holes 222' and second positioning holes 232' for inserting the positioning pins.

In conclusion, according to the above embodiments of the present invention, the stall device provides features of full-open installation/removal and full-angle brake. With the driving source connection module that is installed by means of non-axial insertion on a transmission shaft, complex calibration and inconvenience caused by axial installation can be eliminated. Further, when test items that do not need the stall function are carried out, a part or entire of the driving source connection module can be quickly and conveniently removed, so as to reduce the moment of inertia of synchronous rotation with the motor under test in course of testing. Meanwhile, a clamping force can be applied by the brake module to any position as desired on edges of the driving source connection module so that the stall angle of the transmission shaft and the motor under test connected thereto is not limited, hence improving convenience and functionality of control and operation of the motor test system.

The present disclosure is illustrated by various aspects and embodiments. However, persons skilled in the art understand that the various aspects and embodiments are illustrative rather than restrictive of the scope of the present disclosure. After perusing this specification, persons skilled in the art may come up with other aspects and embodiments without departing from the scope of the present disclosure. All equivalent variations and replacements of the aspects and the embodiments must fall within the scope of the present disclosure. Therefore, the scope of the protection of rights of the present disclosure shall be defined by the appended claims.

What is claimed is:

1. A full-open and full-angle stall device for a motor test system, comprising:
    a base;
    a driving source connection module, comprising a coupling and a first disc and a second disc that are detachably joined together, the first disc and the second disc fixed on the coupling, the coupling defined with a mounting hole for connecting a transmission shaft so as to receive a driving source from a motor under test; and
    a brake module, disposed on the base and configured at an edge of the driving source connection module, the brake module being controlled to generate a clamping force on the driving source connection module, wherein the clamping force is selectively applied to any edge of at least one of the first disc and the second disc so as to brake the driving source connection module.

2. The stall device according to claim 1, wherein the coupling has a first bushing fixed on the first disc and a second bushing fixed on the second disc.

3. The stall device according to claim 2, wherein the first disc and the second disc have a plurality of through holes, respectively.

4. The stall device according to claim 1, wherein once the first disc and the second disc are joined, the first disc and the second disc have a window formed at a center part for the transmission shaft to pass through, the first disc is fixed on a part of the coupling, and the second disc is fixed on the other part of the coupling.

5. The stall device according to claim 4, wherein the first disc and the second disc have a plurality of through holes, respectively.

6. The stall device according to claim 1, further comprising a plurality of positioning pins, each of the positioning pins embedded between the first disc and the second disc.

7. The stall device according to claim 6, wherein the first disc has a plurality of first positioning holes for inserting the corresponding positioning pins, and the second disc has a plurality of second positioning holes for inserting the corresponding positioning pins.

8. The stall device according to claim 6, wherein the brake module comprises a plurality of brakes distributed around the driving source connection module, and each brake is for applying the clamping force at the edge of the corresponding first disc or the second disc so as to brake the driving source connection module.

9. The stall device according to claim 6, wherein a first abutting surface of the first disc and a second abutting surface of the second disc are coplanar with a central axis of the mounting hole.

10. A full-open and full-angle stall device for a motor test system, comprising:
    a base;
    a driving source connection module, comprising a first connecting unit and a second connecting unit detachably joined together, a body of the first connecting unit having a first disc section and a first bushing section, and a body of the second connecting unit having a second disc section and a second bushing section; wherein, on the basis of joining of the first connecting unit and the second connecting unit with each other, the first bushing section and the second bushing section define a mounting hole for connecting a transmission shaft so as to receive a driving source from a motor under test; and
    a brake module, disposed on the base and configured at an edge of the driving source connection module, the brake module being controlled to generate a clamping force on the driving source connection module, wherein the clamping force is selectively applied to any edge of at least one of the first disc and the second disc so as to brake the driving source connection module.

11. The stall device according to claim 10, wherein the first disc section and the second disc section have a plurality of through holes, respectively.

12. The stall device according to claim 10, further comprising a plurality of positioning pins, each of the positioning pins embedded between the first disc section and the second disc section that are joined together.

13. The stall device according to claim 12, wherein the first disc section has a plurality of first positioning holes for inserting the corresponding positioning pins, and the second disc section has a plurality of second positioning holes for inserting the corresponding positioning pins.

14. The stall device according to claim 12, wherein the brake module comprises a plurality of brakes distributed around the driving source connection module, and each brake is for applying the clamping force on the edge of the corresponding first disc or the second disc so as to brake the driving source connection module.

15. The stall device according to claim 12, wherein a first abutting surface of the first disc section and a second abutting surface of the second disc section are coplanar with a central axis of the mounting hole.

* * * * *